United States Patent
Leifer et al.

(10) Patent No.: US 8,766,757 B2
(45) Date of Patent: Jul. 1, 2014

(54) TRANSLATORY FASTENING ELEMENT FOR DETACHABLY FASTENING A CURRENT CONDUCTOR TO A CURRENT TRANSFORMER HOUSING

(75) Inventors: Christoph Leifer, Bad Driburg (DE); Carsten Thörner, Melle (DE); Dat-Minh Trinh, Barntrup (DE)

(73) Assignee: Phoenix Contact GmbH & Co. KG., Blomberg (DE)

( * ) Notice: Subject to any disclaimer, the term of this patent is extended or adjusted under 35 U.S.C. 154(b) by 0 days.

(21) Appl. No.: 13/515,070

(22) PCT Filed: Dec. 17, 2010

(86) PCT No.: PCT/EP2010/070073
§ 371 (c)(1),
(2), (4) Date: Oct. 2, 2012

(87) PCT Pub. No.: WO2011/083030
PCT Pub. Date: Jul. 14, 2011

(65) Prior Publication Data
US 2013/0015934 A1    Jan. 17, 2013

(51) Int. Cl.
*H01F 27/26* (2006.01)
*H01F 17/06* (2006.01)

(52) U.S. Cl.
USPC ............................ 336/210; 336/175; 336/176

(58) Field of Classification Search
USPC ............ 336/210, 90, 173, 175, 176; 324/127, 324/508, 543
See application file for complete search history.

(56) References Cited

U.S. PATENT DOCUMENTS

| | | | |
|---|---|---|---|
| 5,729,125 A * | 3/1998 | Schweitzer, Jr. | 324/127 |
| 5,990,674 A * | 11/1999 | Schweitzer, Jr. | 324/127 |
| 2002/0000026 A1* | 1/2002 | Noda | 24/458 |
| 2007/0046280 A1 | 3/2007 | Boas | |
| 2007/0176723 A1* | 8/2007 | Renz et al. | 336/210 |
| 2007/0285201 A1 | 12/2007 | Zumoto et al. | |
| 2009/0115403 A1 | 5/2009 | Bernkla | |
| 2010/0066475 A1* | 3/2010 | Goldblatt | 336/92 |

FOREIGN PATENT DOCUMENTS

DE       100 64 375 A1    6/2002

OTHER PUBLICATIONS

International Bureau, English Translation for International Search Report for International Application No. PCT/EP/2010/070073, Jul. 14, 2011, pp. 1-2, Geneva, Switzerland.

(Continued)

*Primary Examiner* — Alexander Talpalatski
*Assistant Examiner* — Mangtin Lian
(74) *Attorney, Agent, or Firm* — Ohlandt, Greeley, Ruggiero & Perle, LLP

(57) ABSTRACT

The invention relates to a device for detachably fastening a current conductor (10) to a current transformer housing (12) comprising a fastening element (16, 32), wherein the fastening element (16, 32) can be guided such that the fastening element (16, 32) at least partially contacts the surface of the current conductor (10) in a fastening state of the current conductor (10) on the current transformer housing (12). The invention is characterized in that the fastening element (16, 32) is implemented such that it performs a translatory displacement in the direction of the current conductor (10) when transitioning from an unfastened state to the fastened state of the current conductor (10) to the current transformer housing (12).

6 Claims, 2 Drawing Sheets

(56) References Cited

OTHER PUBLICATIONS

International Bureau, English Translation of the Written Opinion of the International Search Authority for International Application No. PCT/EP/2010/070073, Jul. 3, 2012, pp. 1-4, Geneva, Switzerland.

International Bureau, English Translation of International Preliminary Report on Patentability Chapter I for International Application No. PCT/EP/2010/070073, Jul. 4, 2012, pp. 1-5, Geneva, Switzerland.

* cited by examiner

TRANSLATORY FASTENING ELEMENT FOR DETACHABLY FASTENING A CURRENT CONDUCTOR TO A CURRENT TRANSFORMER HOUSING

CROSS-REFERENCE TO RELATED APPLICATIONS

This application is a United States national stage entry of International Application serial no. PCT/EP2010/070073 filed Dec. 17, 2010, which claims priority to German patent application no. 10 2009 059 012.9 filed Dec. 17, 2009. The contents of both of these prior applications are incorporated herein by reference in their entirety as if set forth verbatim.

FIELD

The innovation applies to a device for the detachable attachment of a conductor on a transformer housing with a fastening element, whereby the fastening element must be routed, so that the fastening element is placed onto the surface of the conductor at least partially when the conductor is attached to the transformer.

BACKGROUND

A conductor is usually routed through an opening that is provided on the transformer housing. The conductor is attached on the transformer housing with two screws or threaded pins, which are routed in two holding elements arranged on the transformer housing. For the purpose of fastening, the screws and/or threaded pins are turned inside of the holding element with a purely rotating movement in the direction of the conductor until their cross section is placed onto the surface of the conductor. Continued turning of the screws and/or threaded pins will result in securing the conductor in the transformer housing.

The disadvantage is hereby that the threaded pins and/or screws must travel a relatively long path for fastening on the conductor, whereby this occurs exclusively with a purely rotating movement, which requires a lot of force and time, especially with a larger number of transformer housings to be secured on a conductor.

Therefore, the innovation is based on the task to provide a device to fasten a conductor on a transformer housing, which is marked by a more simplified and faster installation.

SUMMARY

The solution for this task occurs according to the innovation with the characteristics of claim 1. Advantageous designs of the innovation are indicated in the subclaims.

The innovation-based device to fasten a conductor on a transformer housing has a fastening element, whereby the fastening element must be waged so that the fastening element is at least partially placed onto the surface of the conductor when the conductor is fastened on the transformer housing. The fastening element is characterized in that the fastening element is designed so that it performs a translational movement in the direction of the conductor when the condition of the conductor and the transformer housing is changed from unfastened to fastened.

The fastening element, which has translational movement, can be used to attach the conductor on the transformer housing, so that the fastening is hereby fastened. Because the movement of the fastening element is purely translational to transfer from an unfastened to the fastened state, the installation expenditure for the device according to the innovation is significantly simplified compared to the state-of-the art devices that are currently known and the installation is significantly shorter. A turning movement and/or rotating movement of the fastening element is no longer necessary for the solution according to the innovation.

According to a preferred design of the innovation, the fastening element encompasses the transformer housing around its external surrounding surface and is routed along the external surrounding area of the transformer housing. The fastening element is thereby preferably designed in the shape of a ring that surrounds the transformer housing, whereby the contour of the fastening element of the fastening element is adjusted to the contour of the external surrounding surface of the transformer housing. The fastening element is thereby routed at a specified distance to the external surrounding surface of the transformer housing along the transformer housing. This makes an especially simple and secure routing of the fastening element to attach the conductor possible.

Preferably, one of the external side surfaces of the transformer will have latch mechanisms in which the fastening element is latched in fastened state. The latch mechanisms, designed as snap tabs, must preferably be arranged below each other along an external side surface of the transformer housing, so that the fastening element can be routed along the individual latch mechanisms that are present on the outer side surface of the transformer housing when transferring from the unfastened to the fastened condition with translational movement of the fastening element. The latch mechanisms serve to secure the fastening element at different positions along the transformer housing, so that the fastening element can be flexibly adjusted to the dimensions of the conductor to be fastened. The fastening thereby occurs when the fastening element latches in the latch mechanisms that are provided on the transformer housing in the fastened state. Additional fasteners, such as screws or threaded pins are therefore no longer necessary.

An advantageous design of the innovation is equipped with a lever on the fastening element to secure the fastening element in a specific position. The lever is preferably secured on the outer side surface of the fastening element, which points away from the transformer housing, so that a user can easily operate the lever and it is easily accessible for the user. The lever is preferably arranged in the area of the toothed wheel whereby the lever can be used to block the toothed wheel so that the fastening element and/or the toothed wheel can be secured inside of the snap tab. The provision of such lever significantly simplified handling of the device according to the innovation.

Furthermore, it is preferred to provide that the lever is stored at a shaft with rotation capability. The lever can thereby be moved into an open position and into a closed position. The lever is thereby secured on the shaft with a connecting element. The connecting element may be designed as a toothed wheel or it may have a snap tab, which guides the fastening element along the latch mechanism. The toothed wheel and/or snap tab are thereby preferably designed so that it can latch into the latch mechanism and the fastening element is thereby routed along the desired path on the transformer housing and so that the toothed wheel and/or snap tab can latch into the latch mechanism to secure the fastening element.

In order to guide the fastening element along the outer surrounding area of the transformer is it further preferred to provide a guide rail on the transformer housing. It is thereby preferred that the fastening element has an intervention area that can access the guide rail and/or encompass the guide rail, so that the fastening element can be guided along the guide rail. The guide rail is thereby preferably designed parallel to the latch mechanisms that are arranged on the transformer housing on the outside area of the transformer housing. The guide rail is used to provide an additional guide for the fastening element along the outside area of the transformer housing so that especially tilting and/or dumping of the fastening element can be prevented. Especially twisting of the fastening element can thereby be prevented.

According to another preferred design of the innovation, the fastening element is routed through an opening that is provided in a holding element that is arranged on the transformer housing. The fastening element will thereby preferably routed within the opening of the holding element so that it can be switched from the unattached to the attached condition and vice-versa. The holding element must preferably be designed in form of a flange, which is arranged on the outside area of the transformer housing and protrudes from same so that the fastening element can be routed at a specific distance to the transformer housing. The guide of the fastening element within an opening in the holding element enables the targeted routing of the fastening element in the direction of the bus bar to enable a secure attachment of a conductor.

It must thereby preferably be provided that the fastening element has latch mechanisms along its longitudinal axis, whereby the latch mechanisms are a hook element within the opening in which the latch mechanisms can latch. The latch mechanisms that are arranged on the fastening element, and which are preferably designed in form of snap tabs, the securing of the fastening element is possible in a desired position as soon as the fastening element is placed onto the conductor. The latch mechanisms that are placed along its longitudinal axis enable securing of the fastening element in any position so that conductors with different dimensions can be secured on a transformer housing with the fastening element. For example, the hook element may be designed in form of a bridge, which can latch into the latch mechanism. As soon as the hook element latches in one of the latch mechanisms, sliding of the fastening element will be prevented so that the fastening element can be secured permanently in this position and securing of the conductor is thereby also made possible in that the fastening element is attached to the conductor in this position.

The innovation will be explained in further detail below with reference to the attached drawings based on preferred designs.

DETAILED DESCRIPTION

Figure 1:
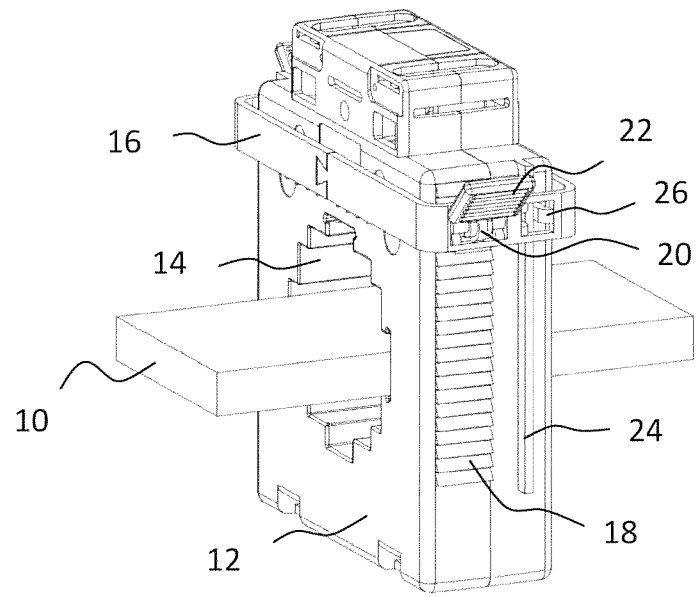
FIG. 1 shows a schematic illustration of the device according to the innovation according to an initial design in unsecured condition.

FIG. 1 shows a device according to the innovation for the detachable fastening of a conductor 10 on a transformer housing 12, whereby the conductor 10 is fed through an opening 14 provided on a transformer housing 12. The transformer housing 12 has two retaining elements 16. One fastening 18 is positioned on each one with panning capability. FIG. 1 shows the device according to the innovation in a secured state where the fastening element 18 is at least partially placed onto the surface of the conductor 10. The fastening element 18 has a retaining clip 20 and a lever 22 on the retaining clip 20. The retaining clip 20 is placed on the surface of the conductor 10 in the secured state. The retaining clip 20 is designed in form of a bridge, whereby an open end 24 of the retaining clip 20 has a curved area, whereby the curve of the curved area points away from the conductor 10. The retaining clip 20 is hereby placed onto the surface of the conductor 10 in the area of its curved area. The lever 22 also has a curved area at its open end 32, whereby the lever 22 is easier to handle for a user.

Figure 2:
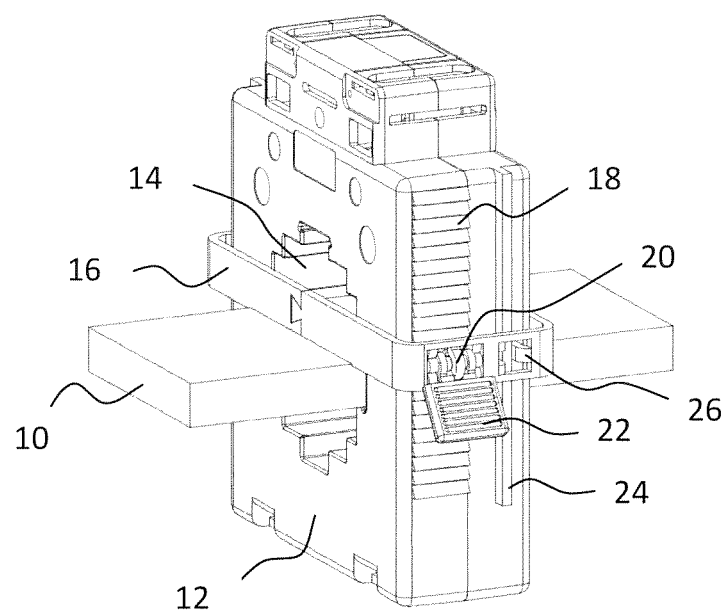
FIG. 2 shows another schematic illustration of the device shown in FIG. 1 according to the innovation in secured condition.

FIGS. 1 and 2 show a device according to the innovation to fasten a conductor 10 on a transformer housing 12 according to an initial design.

The conductor 10 is routed through an opening 14 that is provided on the transformer housing 12. Securing the conductor 10 on the transformer housing 12 occurs with a fastening element 16, whereby the fastening element 16 encompasses the outer area of the transformer housing 12 and is routed along the outer area of the transformer housing 12. The fastening element 16 is thereby designed in form of a ring, whereby its form is adjusted to the outer area of the transformer housing 12. The fastening element 16 is routed at a specific distance to the outer area of the transformer housing 12. Several latch mechanisms 18 in form of snap tabs are designed along an outer area of the transformer housing 12, whereby the latch mechanism 18 are arranged in a row underneath each other along an outside area of the transformer housing 12. To guide the fastening element 16 along the latch mechanism 18, a connecting element 20 is arranged along the latch mechanisms 18, which can latch into latch mechanisms 18.

A lever 22 is provided on the fastening element 16 to secure the fastening element 16 in the desired position, which is located on a shaft 42 with rotating capacity through connecting element 20, to move the lever 22 into an open position, in which the fastening element 16 can be moved and a closed position, where the fastening element 16 is secured in the desired position. For example, the connecting element 20 may be designed as a toothed wheel or have a latch mechanism, which can be moved depending on the position of the lever 22 within the latch mechanism 18 or that snaps into the latch mechanism 18 so that the fastening element 16 is secured in this position. To improve the grip of the lever 22, grooves should preferably be arranged on the outside of the lever 22.

FIG. 1 shows the device according to the innovation in an unsecured state, whereby the fastening element 16 is not placed onto the surface of the bus bar 10. The lever 22 is tilted up so that the toothed wheel 20 is freely movable and can be guided along the latch mechanism 18.

FIG. 2 shows the device according to the innovation in the secured state, whereby the fastening element 16 must at least partially be placed onto the surface of the conductor 10. The lever 22 is deviated into a position pointing down, whereby the toothed wheel 20 is secured into his position with lever 22, so that the fastening element 16 cannot be moved out of this position. The fastening element 16 cannot be released until the lever 22 is moved back into the position in which the lever 22 points up.

As shown in FIGS. 1 and 2, a guide rail 24 is provided parallel to the latch mechanisms on one of the outside areas of the transformer housing 12, whereby the fastening element 16 is routed along the guide rail 24. For this purpose, guide mechanisms 26 are designed on the fastening element 16, for example in form of individual arm elements, which latch into the guide rail 24 or partially encompass it so that the fastening element 16 can be routed along the guide rail 24. The guide mechanisms 26 are designed in form of bridges for the design shown here, which are bent by the fastening element 16 based on the direction of the transformer housing 12.

Figure 3:
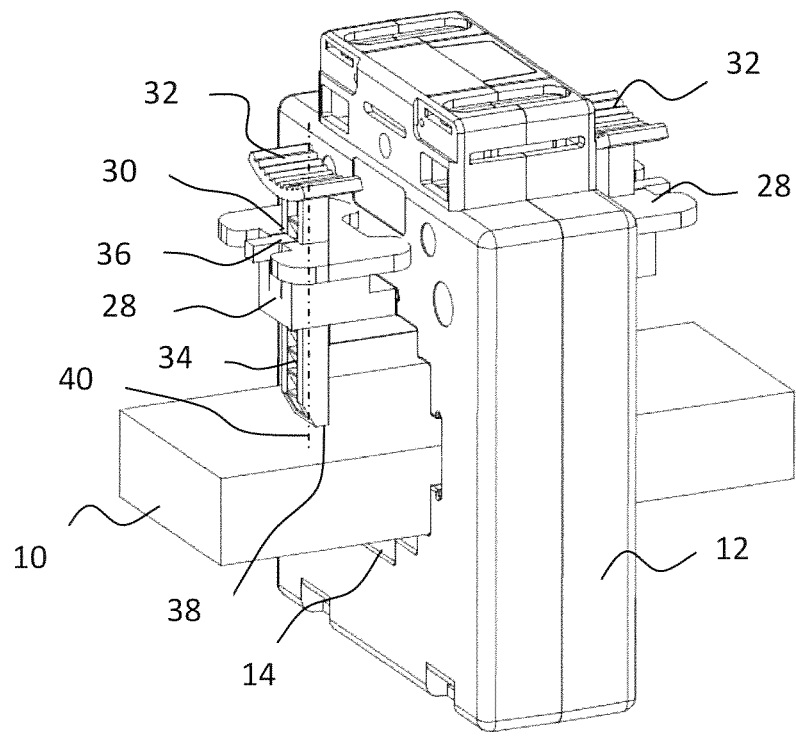
FIG. 3 shows a schematic illustration of a device according to the innovation according to a second design.

FIG. 3 shows a device according to the innovation according to a second design, where a conductor 10 is fed through an opening 14 that is provided on a transformer housing 12. Two holding elements 28 are provided on the transformer housing 12, which have an opening 30 each, through which one fastening element 32 each is routed. The fastening element 32 has several latch mechanisms 34 along its longitudinal axis 40, which can be latched into a hook element 36 provided at the opening 30. The hook element 36 is preferably arranged spring-loaded on the holding element 28 so that the latch mechanisms 34 can be routed along the hook element, especially with movement in the direction of the conductor 10. To move the fastening element 32 away from the conductor 10, the hook element 36 can be deflected so that the latch mechanisms 34 can pass by the hook element 26. The conductor 10 is secured with a free end 83 on the fastening 32 which is placed onto the surface of the conductor 10 in the secured state and thereby secures the conductor 10 on the transformer housing 12.

REFERENCE CODE LIST

Conductor 10
Transformer housing 12
Opening 14
Fastening element 16
Latch mechanism 18
Connecting element 20
Lever 22
Guide rail 24
Guide mechanism 26
Holding element 28
Opening 30
Fastening element 32
Latch mechanism 34
Hook element 36
Free end 38
Longitudinal axis 40
Shaft 42

What is claimed is:

1. A device for the removable attachment of a conductor on a transformer housing with outer areas, the device comprising a fastening element, wherein the fastening element is routed so that the fastening element is at least partially placed onto the surface of the conductor in a secured state of the conductor on the transformer housing, wherein the fastening element performs a translational movement in the direction of the conductor during the transfer from an unsecured state to the secured state of the conductor on the transformer housing, wherein a lever to secure the fastening element is provided at a specific position on the fastening element, and wherein the lever is mounted having rotating capacity on a shaft.

2. A device for the removable attachment of a conductor on a transformer housing with outer areas, the device comprising a fastening element, wherein the fastening element is routed so that the fastening element is at least partially placed onto the surface of the conductor in a secured state of the conductor on the transformer housing, wherein the fastening element performs a translational movement in the direction of the conductor during the transfer from an unsecured state to the secured state of the conductor on the transformer housing, wherein the fastening element encompasses the transformer housing and is routed along the outer area of the transformer housing, wherein a lever to secure the fastening element is provided at a specific position on the fastening element, and wherein the lever is mounted with rotating capacity on a shaft.

3. The device of claim 2, further comprising latch mechanisms on an outside area of the transformer housing to which the fastening element latches when in the secured state.

4. The device of claim 1, further comprising a guide rail on the transformer housing to guide the fastening element along the outer area of the transformer housing.

5. The device of claim 1, wherein the fastening element is routed at an opening provided on a holding element that is arranged on the transformer housing.

6. A device for the removable attachment of a conductor on a transformer housing with outer areas, the device comprising a fastening element, wherein the fastening element is routed so that the fastening element is at least partially placed onto the surface of the conductor in a secured state of the conductor on the transformer housing, wherein the fastening element performs a translational movement in the direction of the conductor during the transfer from an unsecured state to the secured state of the conductor on the transformer housing, wherein the fastening element is routed at an opening provided on a holding element that is arranged on the transformer housing, and wherein the fastening element has latch mechanisms along a longitudinal axis of the fastening element, wherein the latch mechanisms can latch into a hook element in the opening.

* * * * *